United States Patent
Zhai et al.

(10) Patent No.: US 7,989,956 B1
(45) Date of Patent: Aug. 2, 2011

(54) INTERCONNECTS WITH IMPROVED ELECTROMIGRATION RELIABILITY

(75) Inventors: Jun Zhai, Mountain View, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/933,533

(22) Filed: Sep. 3, 2004

(51) Int. Cl.
*H01L 29/66* (2006.01)
(52) U.S. Cl. ............................... 257/774; 257/E23.155
(58) Field of Classification Search ................. 257/618, 257/623, 624, 758, 774, 622, 773, E23.155
See application file for complete search history.

(56) References Cited

U.S. PATENT DOCUMENTS

| | | | | |
|---|---|---|---|---|
| 6,127,260 A * | 10/2000 | Huang | ......................... | 438/629 |
| 6,353,269 B1 * | 3/2002 | Huang | ......................... | 257/296 |
| 6,498,384 B1 * | 12/2002 | Marathe | ..................... | 257/520 |
| 6,731,007 B1 * | 5/2004 | Saito et al. | ................ | 257/762 |
| 6,904,675 B1 * | 6/2005 | Atakov et al. | ................ | 29/852 |
| 2002/0109233 A1 * | 8/2002 | Farrar | .......................... | 257/762 |
| 2003/0173675 A1 * | 9/2003 | Watanabe et al. | ........... | 257/758 |
| 2003/0183942 A1 * | 10/2003 | Harada | ........................ | 257/776 |

* cited by examiner

*Primary Examiner* — Bradley K Smith
*Assistant Examiner* — Amar Movva
(74) *Attorney, Agent, or Firm* — Harrity & Harrity, LLP

(57) ABSTRACT

An interconnect structure in a semiconductor device may be formed to include a number of segments. Each segment may include a first metal. A barrier structure may be located between the plurality of segments to enable the interconnect structure to avoid electromigration problems.

19 Claims, 15 Drawing Sheets

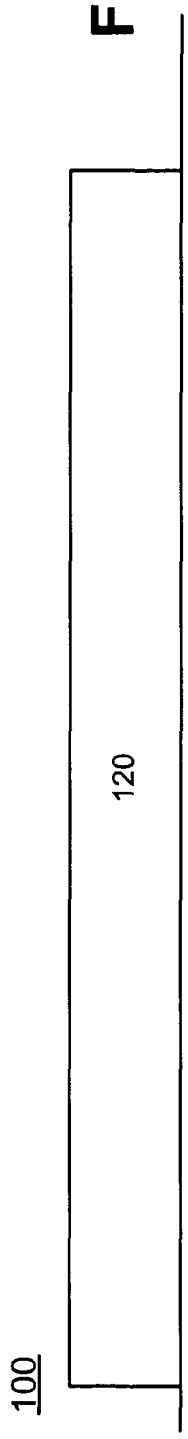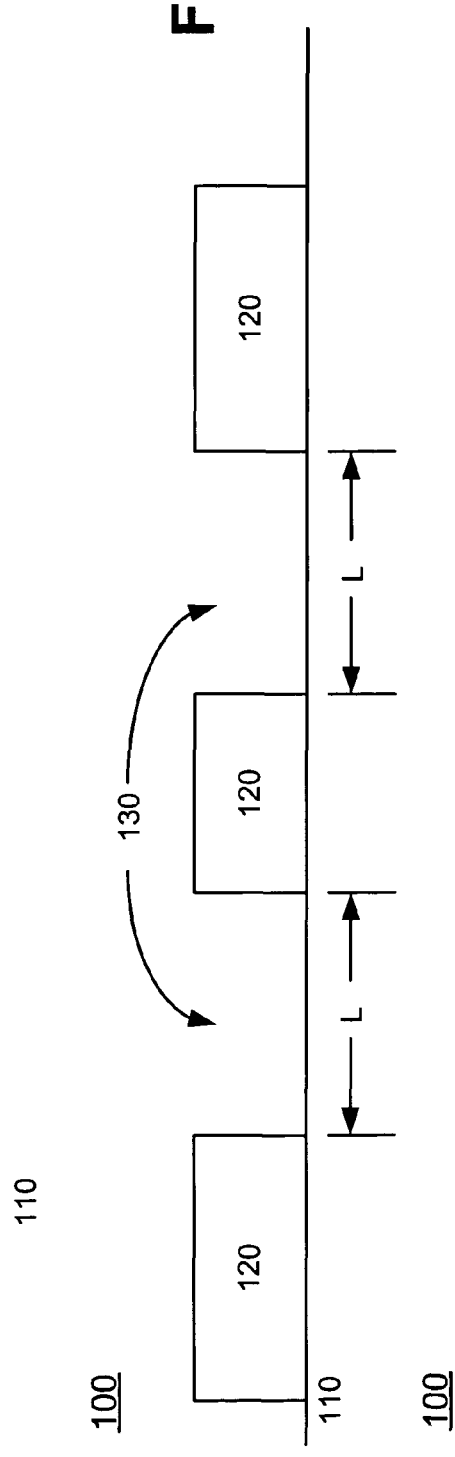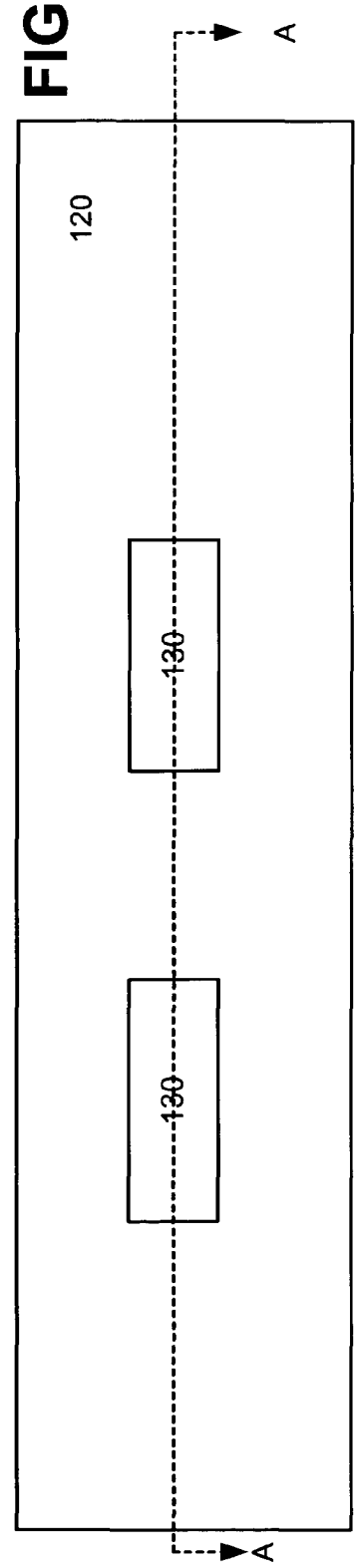

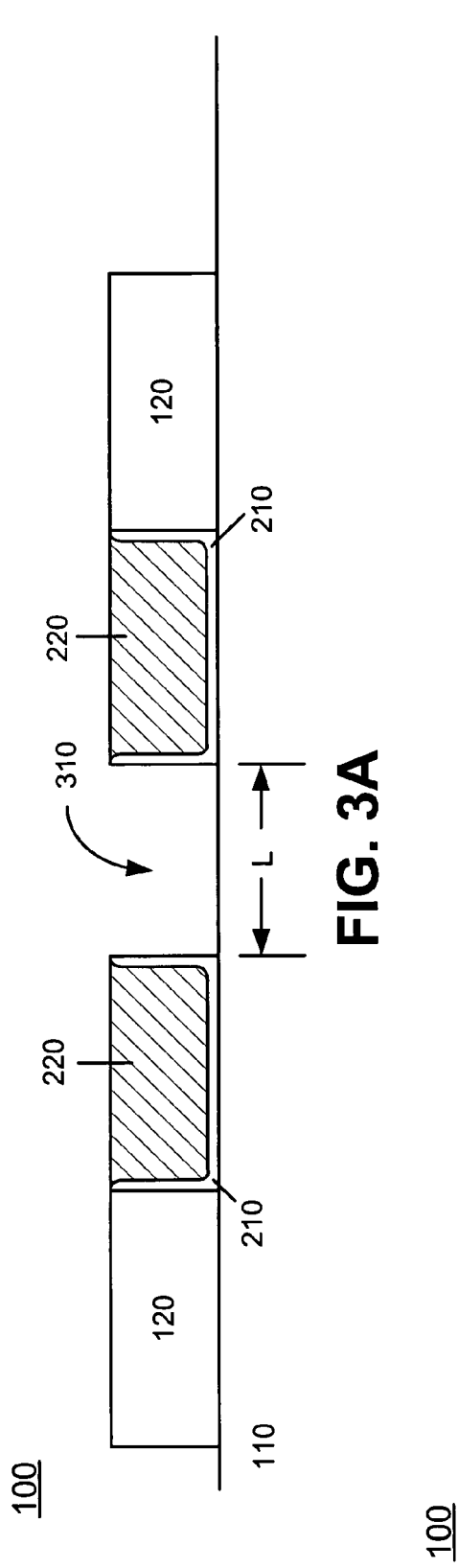
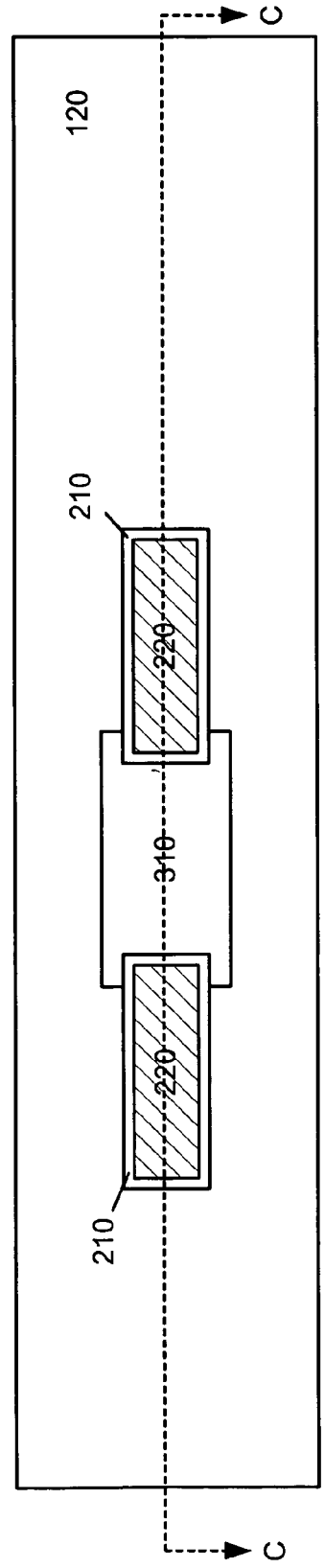

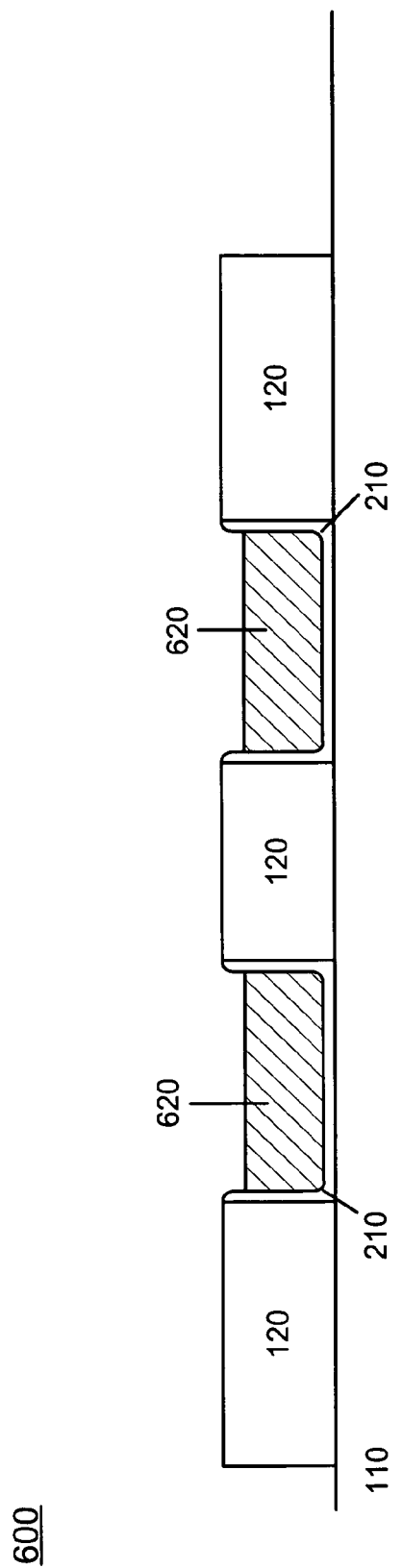

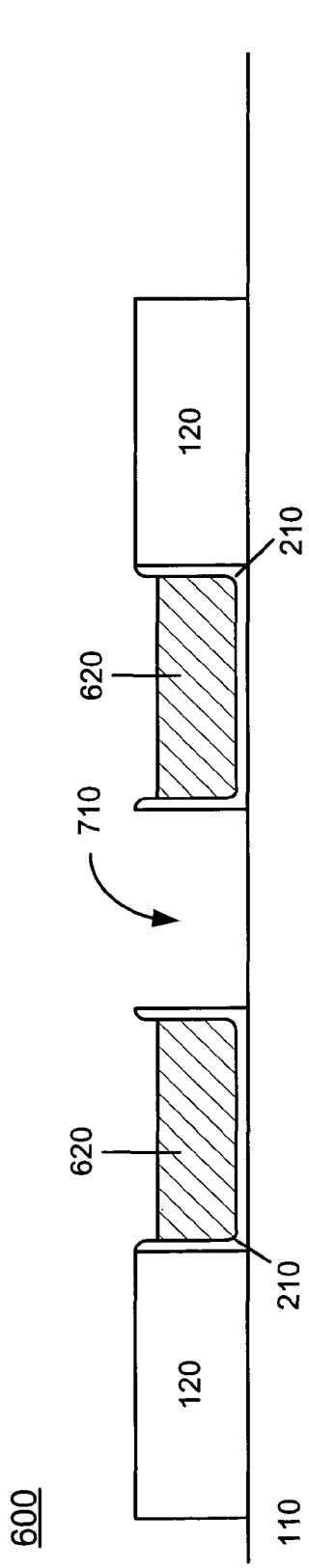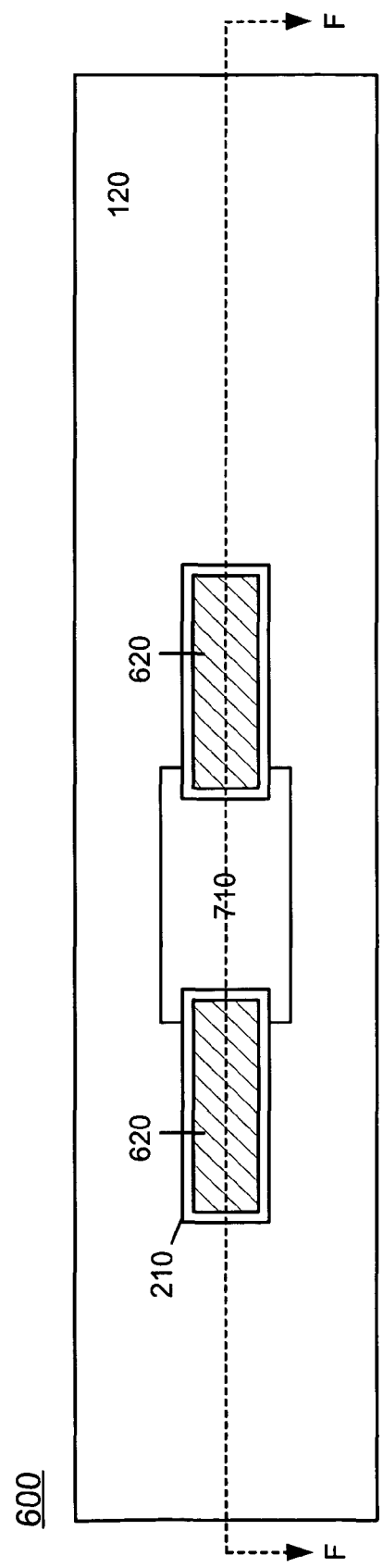

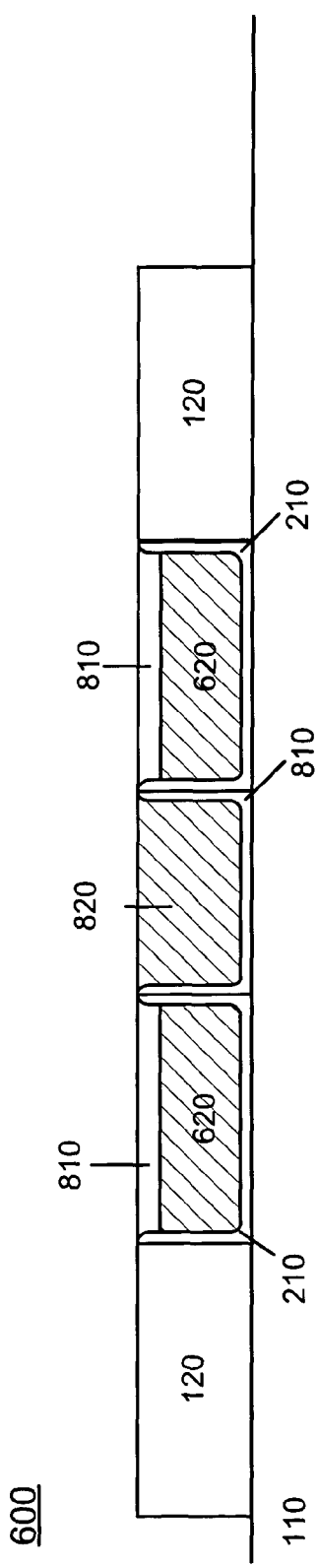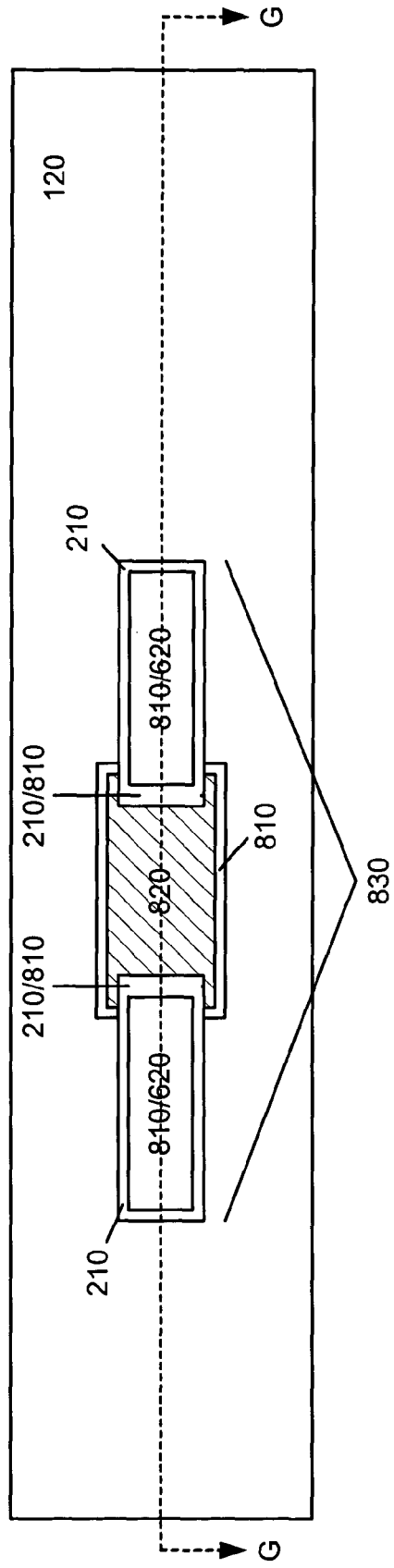
FIG. 8A
FIG. 8B

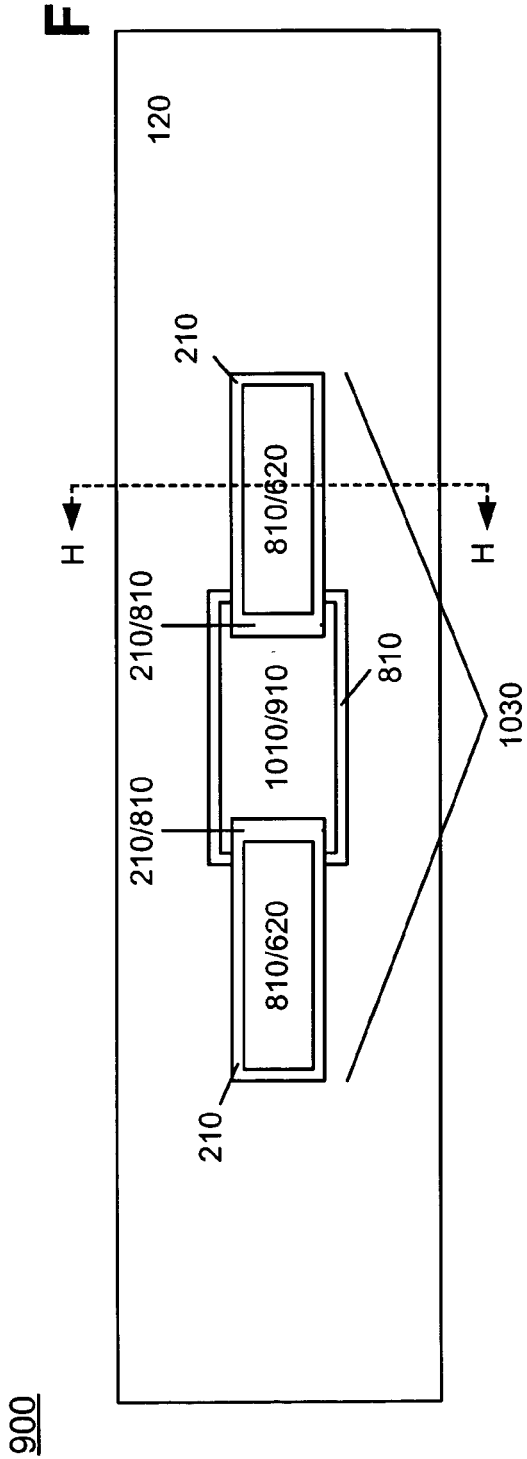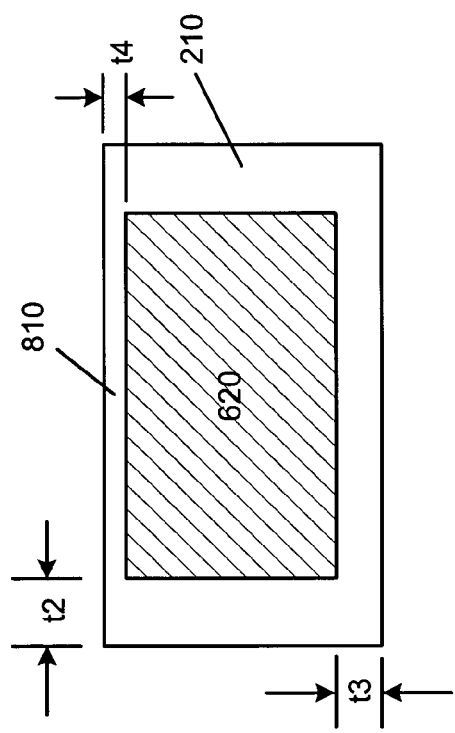

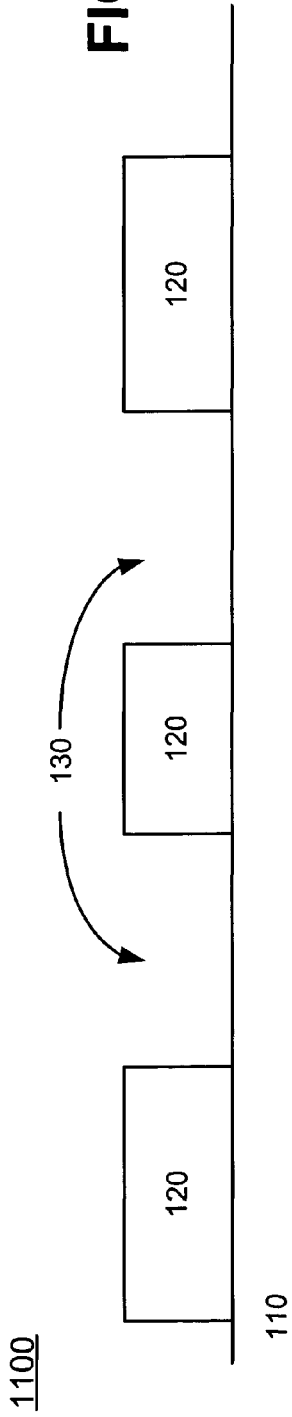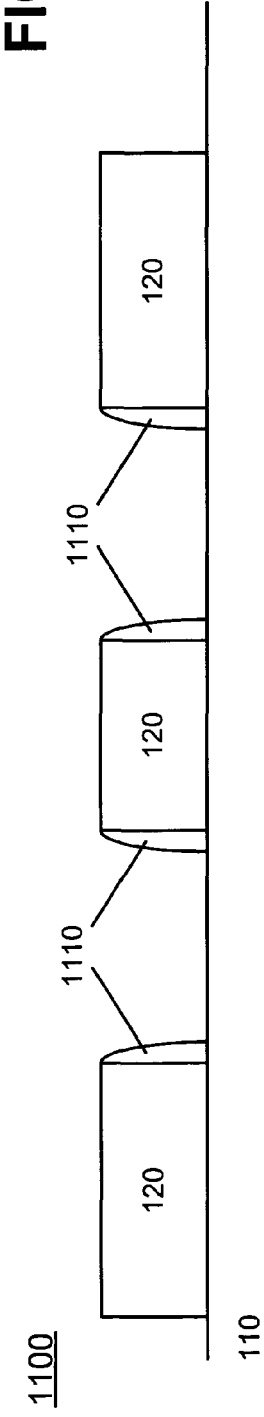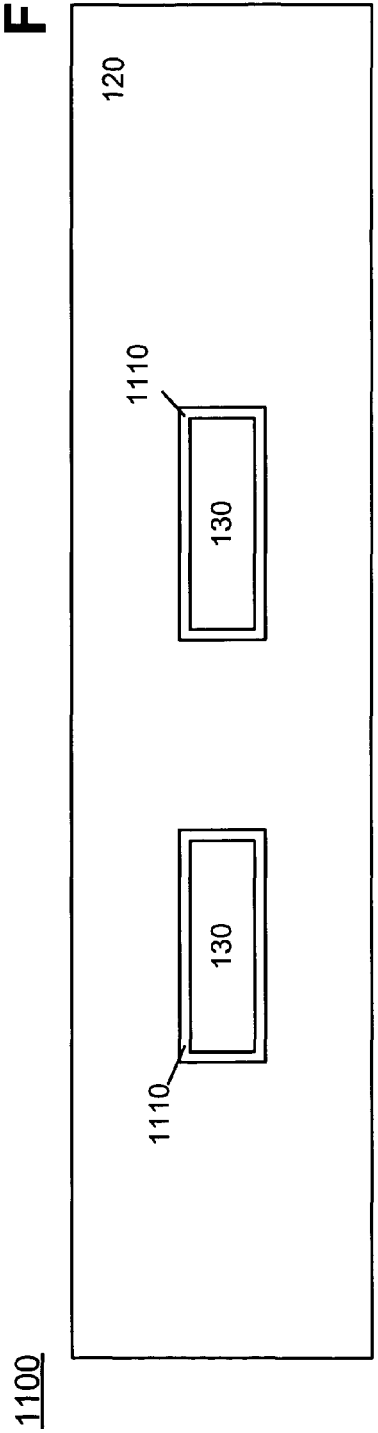

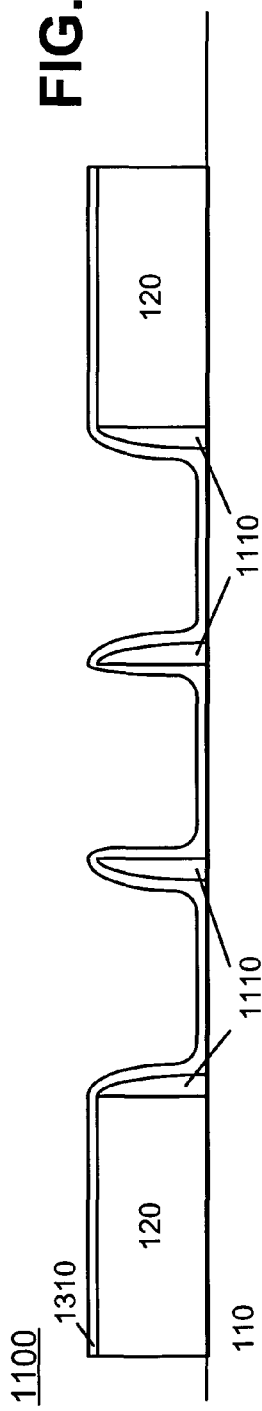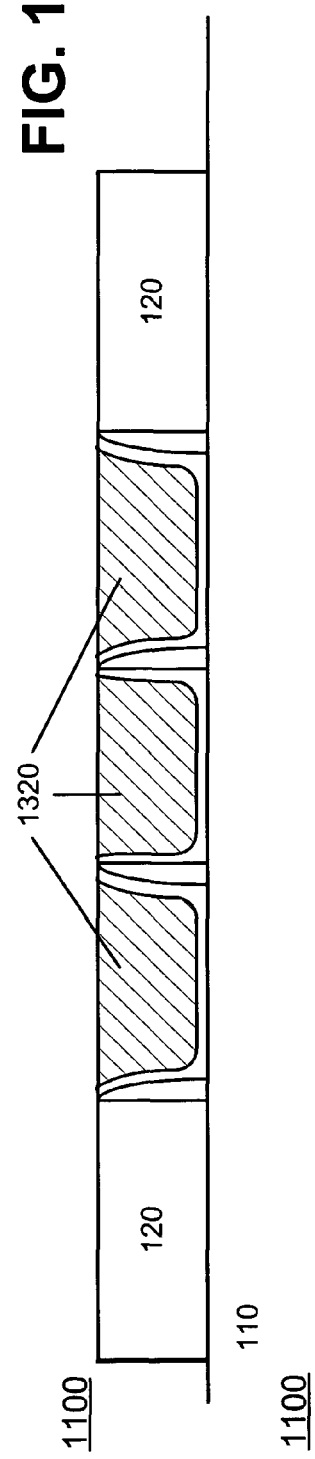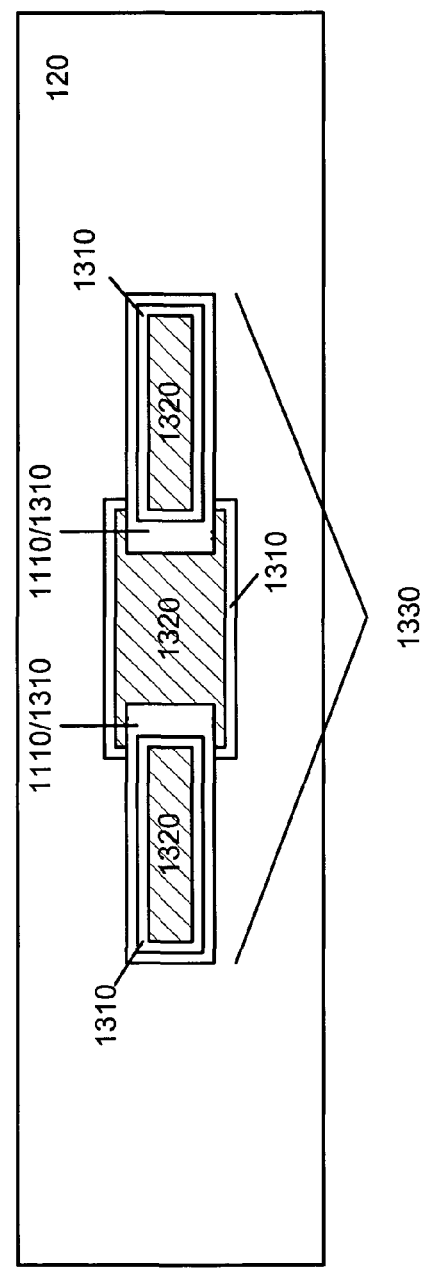

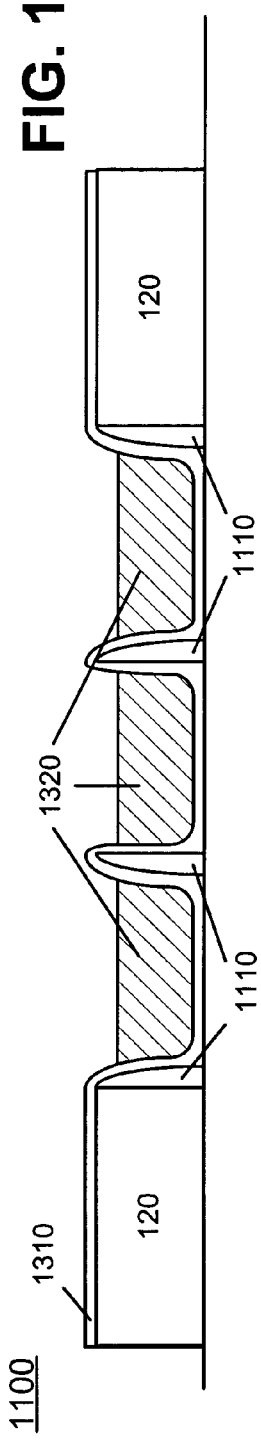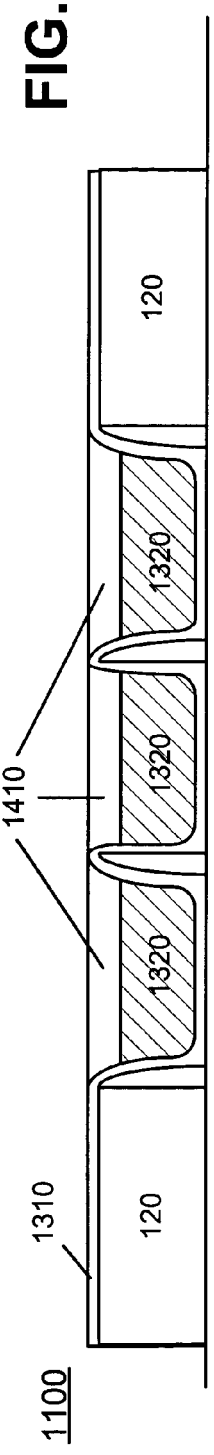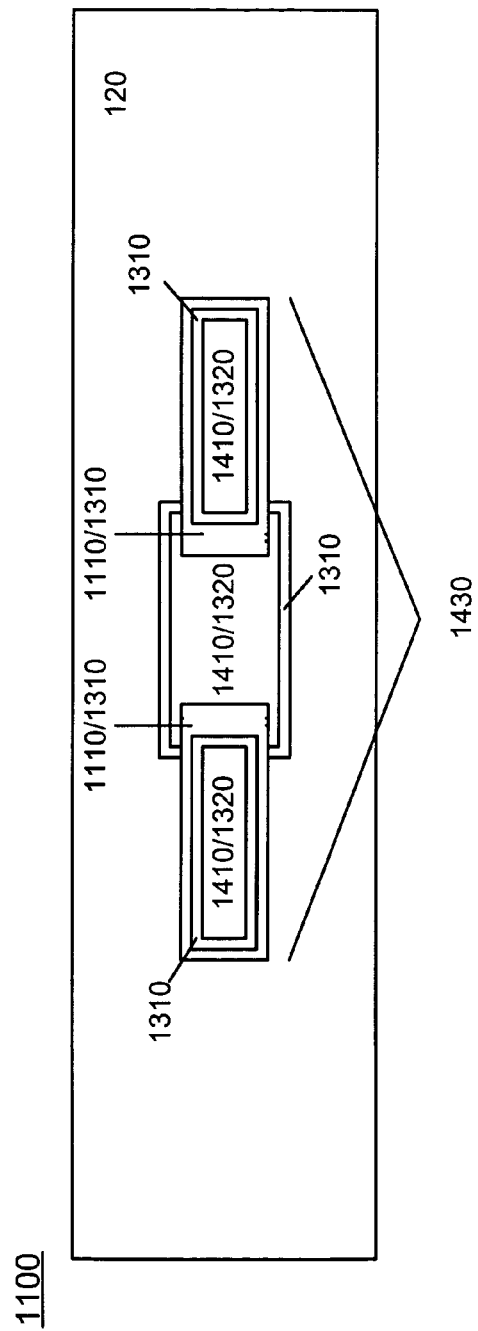

US 7,989,956 B1

INTERCONNECTS WITH IMPROVED ELECTROMIGRATION RELIABILITY

TECHNICAL FIELD

The present invention relates generally to interconnects and, more particularly, to improving reliability for interconnects used in semiconductor devices.

BACKGROUND ART

Reliability is a major concern regarding semiconductor devices. One particular area of concern is electromigration. As device features for transistors become smaller and operating speeds increase, the current density in a transistor's metal lines has increased. The increased current densities often lead to device failures, such as failures due to electromigration.

It has been established that for aluminum straight line via-to-via interconnect structures, there exists a critical current density and length product ($jL_{crit}$), below which electromigration ceases and the interconnect is considered "immortal" due to a balance between the electron wind force and the opposing back stress force. That is, the interconnect will not experience electromigration failure. This effect is known as the Blech effect.

Copper-based interconnects typically suffer from electromigration failure at high current density and operating temperature. The primary cause for electromigration failure is mass transport and depletion driven by electron wind, resulting in voids in the interconnect and therefore, increased resistance. Electromigration usually becomes worse with integration of materials having a low dielectric constant (K) value, such as K<3.

DISCLOSURE OF THE INVENTION

Implementations consistent with the invention provide interconnects with improved reliability by partitioning an interconnect into a number of segments. Each segment may include a barrier layer that acts to hinder atom diffusion along the interconnect.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, an interconnect in a semiconductor device is provided. The interconnect may include a number of segments, where each segment includes a first metal. The interconnect may also include at least one barrier structure located between a first and a second one of the segments.

According to another aspect consistent with the invention, a semiconductor device is provided. The semiconductor device may include a semiconductor substrate and at least one conductive structure formed above the semiconductor substrate. The semiconductor device may also include an interconnect coupled to the conductive structure. The interconnect may include a number of segments, where each segment includes a first metal. The interconnect may also include at least one structure formed between a first and second one of the segments, where the at least one structure includes a second metal.

According to a further aspect consistent with the invention, an interconnect is provided. The interconnect may include a number of segments, where each segment includes a first metal and a second metal. The interconnect may also include at least one structure located between a first and a second one of the plurality of segments.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 1A and 1B are cross-sections illustrating formation of a trench in a dielectric layer, consistent with an embodiment of the invention.

FIG. 1C is a top view of the structure illustrated in FIG. 1B.

FIG. 3A is a cross-section illustrating the formation of a trench in the semiconductor device of FIG. 2A in accordance with an embodiment of the invention.

FIG. 3B is a top view of the semiconductor device illustrated in FIG. 3A.

FIGS. 6-8B are cross-sections and top views illustrating the formation of an interconnect structure in accordance with an embodiment of the invention.

FIGS. 11A-13C are cross-sections and top views illustrating the formation of an interconnect structure in accordance with an embodiment of the invention.

FIGS. 14A-14C are cross-sections and a top view illustrating the formation of an interconnect structure in accordance with an embodiment of the invention.

BEST MODE FOR CARRYING OUT THE INVENTION

Figure 2A:
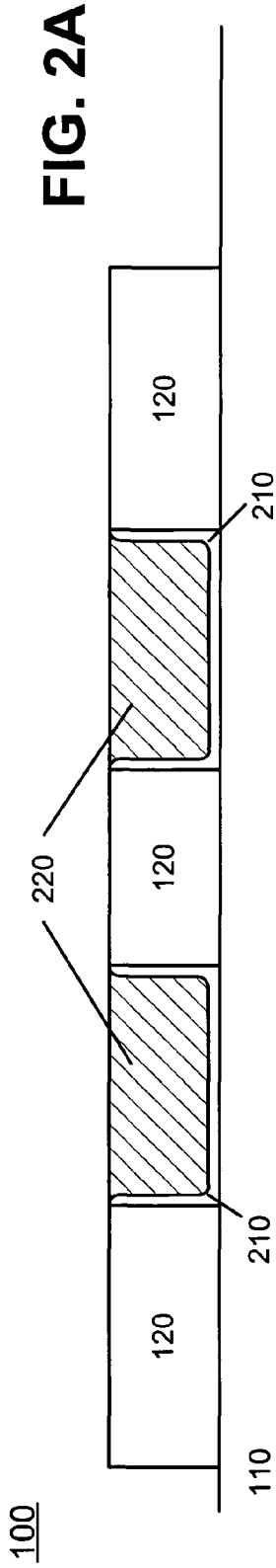
FIG. 2A is a cross-section illustrating the formation of a metal layer in the trench of FIG. 1B in accordance with an embodiment of the invention.

FIG. 1A illustrates the cross-section of a semiconductor device 100 formed in accordance with an embodiment of the invention. Referring to FIG. 1A, semiconductor device 100 may include layer 110 and layer 120 formed thereon. Layer 110 may be an interlayer dielectric formed a number of layers above the surface of a substrate (not shown). For example, semiconductor device 100 may include a substrate with source and drain regions formed therein. A gate oxide layer may be formed on the substrate and a gate electrode, typically comprising doped polycrystalline silicon, may be formed above the gate oxide. An interlayer dielectric, such as layer 110 may be subsequently deposited. A subsequently formed conductive structure, such as one described in more detail below, may act as an interconnect structure to establish electrical contact between, for example, source/drain regions and an upper conductive layer, the gate electrode and an upper conductive layer, the gate electrode and an external connection electrode, etc. Therefore, layer 110 may be an interlayer dielectric formed above a number of conductive layers and other dielectric layers (not shown) in semiconductor device 100. Alternatively, layer 110 may represent a conductive layer or a semiconductor substrate.

Layer 120 may be a dielectric layer formed on layer 110 in a conventional manner. In an exemplary implementation, layer 120 may include a silicon oxide, such as $SiO_2$, and may have a thickness ranging from about 1000 Å to about 10,000 Å. In alternative implementations, layer 120 may be a composite that includes a metal diffusion barrier layer, such as an SiN layer, formed on layer 110 and a low K material, such as $SiO_2$, formed on the metal diffusion barrier layer. An antireflective coating (ARC) layer, such as an SiON layer, may be formed thereon for subsequent lithographic and etching processes.

Trenches 130 may be formed in dielectric layer 120 using conventional photolithographic and etching techniques, as illustrated in FIG. 1B. Trenches 130 may be used for forming segments of an interconnect and may also be used to form contacts or vias for a subsequently formed interconnect. Trenches 130, consistent with the invention, may be formed to each have a length (L) of $L_B$ or less, referred to herein as a Blech length. The Blech length $L_B$ represents a length at which the product of current density j and $L_B$ is below the critical current density and length product (i.e., $jL_{crit}$). The subsequently formed interconnect may then be composed of a number of segments that each have a length $L_B$ or less. Therefore, each segment of the overall interconnect structure formed in accordance with the invention may have a length such that the segment is immortal, thereby rendering the overall interconnect structure immortal as well, as described in more detail below.

FIG. 1C is a top view of semiconductor device 100 illustrated in FIG. 1B. Two trenches 130 are illustrated in FIGS. 1B and 1C for simplicity. It should be understood, however, that additional trenches 130 may be formed in dielectric layer 120 based on the particular circuit requirements, such as the length of the desired interconnect. The top view in FIG. 1C is oriented such that the cross-section in FIG. 1B is taken along line AA in FIG. 1C.

After the formation of trenches 130, a relatively thin barrier layer 210 may be deposited in trenches 130, as illustrated in FIG. 2A. For example, in an exemplary embodiment, a metal layer, such as tantalum, tungsten, or molybdenum may be deposited in trenches 130 to a thickness ranging from, for example, about 10 Å to about 1000 Å. Alternatively, other metals, such as other refractory metals, or combination of metals, may be used to form barrier layer 210.

Next, a metal layer 220, such as copper or aluminum, may be deposited on layer 210 to fill trenches 130. In one implementation, pure copper may be deposited using a physical vapor deposition (PVD) process followed by an electroplating process. The PVD process may deposit a thin layer of copper to cover all or some of barrier layer 210 in trenches 130. The electroplating process may then proceed to fill trenches 130. In other implementations, the metal may be deposited using other techniques. In addition, in some implementations, the copper used to fill trenches 130 may also be doped with impurities. For example, impurities may be introduced into the plating solution to dope the copper used to fill trenches 130.

An annealing process may then be performed followed by a chemical-mechanical polishing (CMP) to planarize the top surface of metal layer 220 so that the metal layer 220 is substantially planar with the top surface of dielectric layer 120, as shown in FIG. 2A.

Figure 2B:
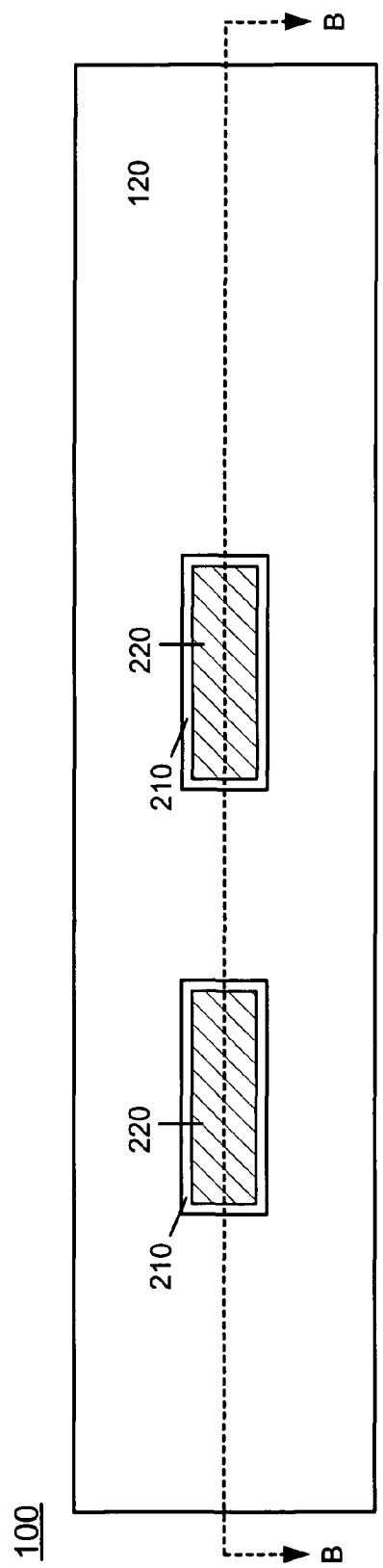
FIG. 2B is a top view of the semiconductor device illustrated in FIG. 2A.

FIG. 2B illustrates a top view of semiconductor 100 including layers 210 and 220 formed in trenches 130. The top view in FIG. 2B is oriented such that the cross-section in FIG. 2A is taken along line BB in FIG. 2B.

A trench 310 may then be formed in dielectric layer 120, as illustrated in FIG. 3A. Trench 310 may be used to connect various segments of a subsequently formed interconnect, as described in more detail below. In an exemplary implementation, the length (L) of trench 310 may be less than $L_B$. FIG. 3B illustrates a top view of semiconductor device 100 illustrated in FIG. 3A. The top view in FIG. 3B is oriented such that the cross-section in FIG. 3A is taken along line CC in FIG. 3B.

Figure 4A:
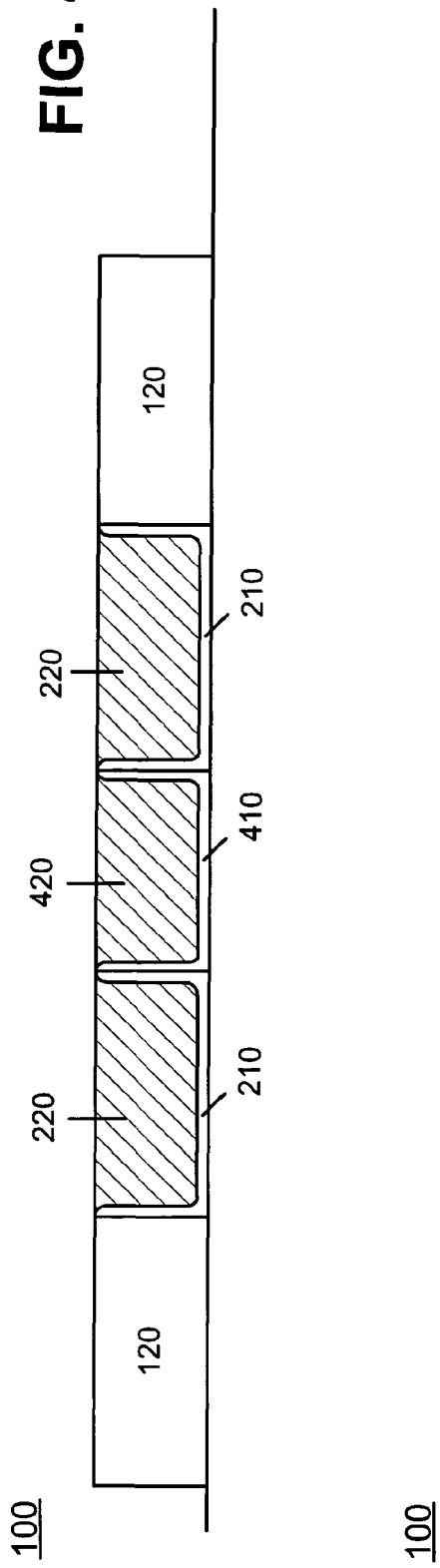
FIG. 4A is a cross-section illustrating an interconnect structure in accordance with an embodiment of the invention.

After forming trench 310, another barrier layer 410 comprising a metal, such as tantalum, tungsten or molybdenum may be deposited in trench 310, as illustrated in FIG. 4A. In an exemplary embodiment, barrier layer 410 may be deposited to a thickness ranging from about 10 Å to about 1000 Å. Alternatively, other metals, such as other refractory metals, or combination of metals, may be used to form barrier layer 410.

Next, a metal layer 420, such as copper or aluminum, may be deposited on barrier layer 410 to fill trench 310. Similar to the discussion above regarding metal layer 220, in an exemplary implementation, metal layer 420 may be deposited using a PVD process to deposit a relatively thin layer of metal followed by an electroplating process. In some implementations, metal layer 420 may comprise, for example, pure copper or doped copper. An annealing process may then be performed followed by a CMP to planarize the top surface of metal layer 420 so that metal layer 420 is substantially planar with the top surface of metal layer 220, as shown in FIG. 4A.

Figure 4B:
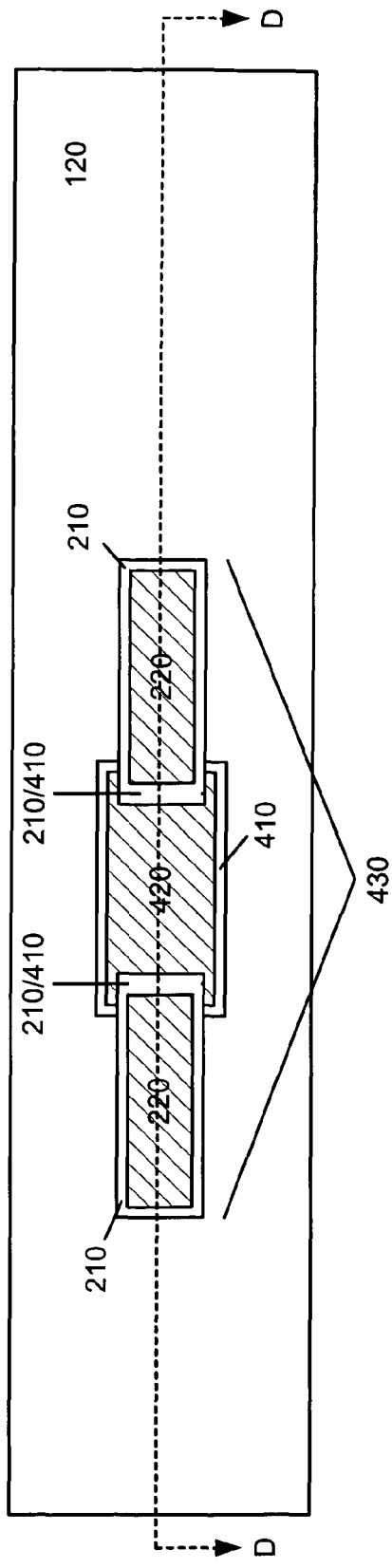
FIG. 4B is a top view of the interconnect structure illustrated in FIG. 4A.

FIG. 4B illustrates a top view of semiconductor device 100 of FIG. 4A. As illustrated, semiconductor device 100 includes an interconnect structure 430 that includes three segments. The first segment includes metal layer 220 and barrier layer 210 located at a left side of structure 430, metal layer 420 and barrier layer 410 located in a center portion of structure 430 and metal layer 220 and barrier layer 210 located at a right side of structure 430. The top view in FIG. 4B is oriented such that the cross-section in FIG. 4A is taken along line DD in FIG. 4B.

Figure 5A:
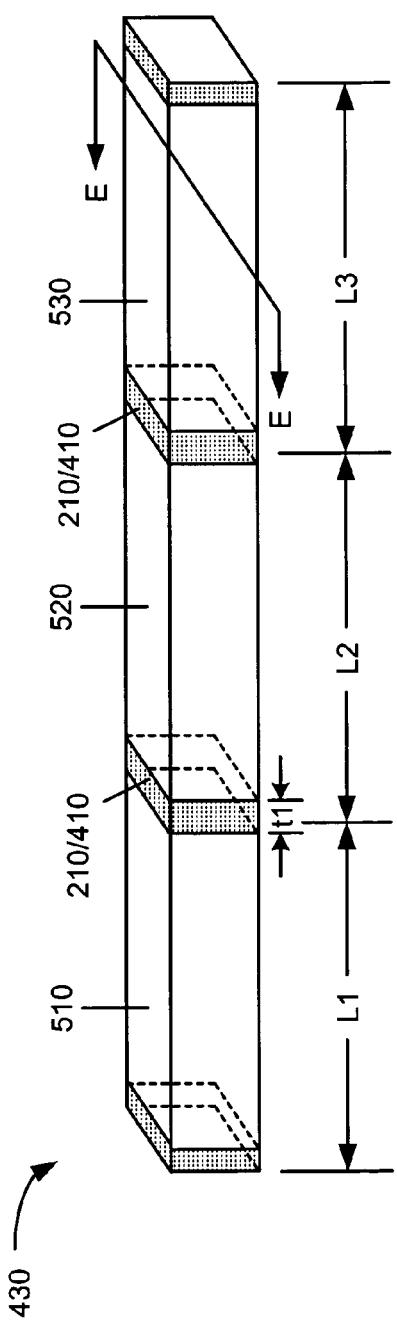
FIG. 5A is a perspective view of the interconnect structure illustrated in FIG. 4B.

FIG. 5A illustrates a perspective view of interconnect structure 430 of FIG. 4B. As illustrated, interconnect structure 430 includes three segments labeled 510, 520 and 530. As discussed above, the length of each of segments 510, 520 and 530 (labeled L1 through L3 respectively) may be designed to be less than or equal to a predetermined distance $L_B$, such that the product of the current density j and length L (i.e., L1, L2 or L3) is less than $jL_{crit}$. That is, when semiconductor device 100 is operating, jL1, jL2 and jL3 are each less than $jL_{crit}$. The particular lengths L1, L2 and L3 may vary based on the particular semiconductor device and its operating requirements. One of ordinary skill in the art, however, would be able to optimize lengths L1, L2 and L3 based on the guidance given herein. In each case, each segment of interconnect structure 430 will not suffer from electromigration failure. Therefore, the overall interconnect structure 430 will also avoid electromigration failure.

Referring back to FIG. 5A, barrier layers 210 and 410 located at the junctions of each of interconnect segments 510-530 essentially form a barrier structure. For example, barrier layers 210 and 410 formed between segments 510 and 520 form a barrier structure having a width labeled t1, which is essentially the combined width of barrier layers 210 and 410. In an exemplary implementation, the width of the barrier structure formed at the junction of two segments (e.g., segments 510 and 520) may range from about 10 Å to about 2000 Å.

Figure 5B:
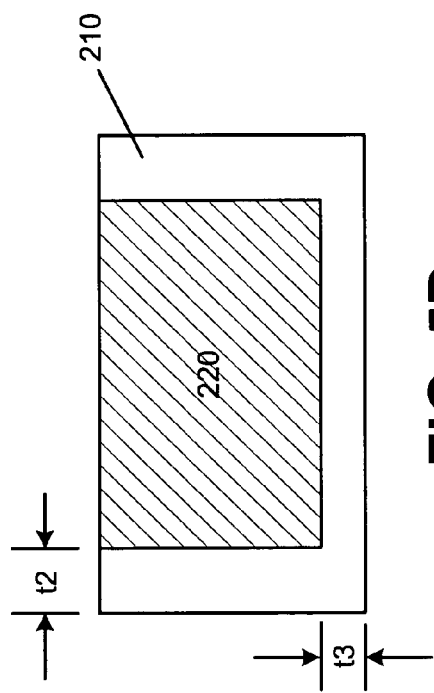
FIG. 5B is a cross-section illustrating one of the segments of the interconnect structure of FIG. 5A.

FIG. 5B illustrates a cross-section of segment 530 taken along line EE in FIG. 5A. As illustrated, segment 530 includes metal layer 220 and barrier layer 210. The thickness of barrier layer 210 formed adjacent the side surfaces of metal layer 220, labeled t2 in FIG. 5B, and the thickness of barrier layer 210 formed adjacent the bottom surface of metal layer 220, labeled t3 in FIG. 5B, may vary based on the particular circuit requirements. In an exemplary implementation, t2 may range from about 10 Å to about 500 Å and t3 may range from about 10 Å to about 500 Å. In some implementations, having a thicker barrier layer formed adjacent the side surfaces of metal layer 220, as opposed to a thicker barrier layer formed along the bottom surface of metal layer 220 may yield the desired results associated with avoiding electromigration.

Barrier structures formed by barrier layers 210 and 410 at the junctions of segments 510, 520 and 530, along with the portions of barrier layers 210 and 410 formed along the side surfaces and bottom surfaces of metal layers 220 and 420 act to impede or stop net atom diffusion along each segment of interconnect structure 430. The resulting interconnect structure 430 also yields a larger backstress gradient in each segment 510-530 as compared to conventional structures. This larger backstress gradient counters any net atom diffusion or mass flux in interconnect structure 430, thereby rendering each segment and the overall interconnect structure 430 immortal. In addition, using barrier layers 210 and 410 may allow the length of each segment to be increased while maintaining its immortality, thereby requiring less segments than would be required without the use of these barrier layers.

For example, it has been found that backstress gradient may increase by a factor $L/L_B$ for a segment having length $L_B$ as compared to an interconnect that is not segmented and has a length L. Therefore, barrier layers 210 and 410 help interconnect structure 430 maintain high reliability, while allowing the length of each segment of the overall structure to be manageable (e.g., not too short).

In an alternative embodiment consistent with the invention, trenches 130 illustrated in FIG. 1B may not be completely filled with metal, such as metal layer 220 illustrated in FIG. 2A. For example, referring to FIG. 6, semiconductor device 600 includes layers 110, 120 and barrier layer 210 formed in trenches 130 in a similar manner as that described above with respect to FIGS. 1A-C and 2A. In this embodiment, however, metal layer 620 may be deposited on barrier layer 210 to a level below the upper surface of dielectric layer 120, as illustrated in FIG. 6. Metal layer 620 may therefore be recessed with respect to the upper surface of dielectric layer 120. For example, in one implementation, metal layer 620 may be formed to a level ranging from about 10 Å to about 1000 Å below the top surface of dielectric layer 120.

In alternative implementations, metal layer 620 may be deposited to fill trenches 130 followed by a CMP process. During the CMP, a top portion of metal layer 620 may be removed, resulting in the top surface of metal layer 620 being recessed with respect to the upper surface of dielectric layer 120, as illustrated in FIG. 6. In still other alternatives, a relatively short etching process may be performed to remove a top portion of metal layer 620 such that metal layer 620 is recessed, as illustrated in FIG. 6.

In each of the above cases, metal layer 620 may comprise copper or aluminum. In addition, metal layer 620 may be deposited using, for example, a PVD process followed by an electroplating process. Metal layer 620 may also include, for example, pure copper or doped copper.

After metal layer 620 is formed, trench 710 may be formed in dielectric layer 120, as illustrated in FIG. 7A. FIG. 7B illustrates a top view of semiconductor device 600 illustrated in FIG. 7A. The top view in FIG. 7B is oriented such that the cross-section in FIG. 7A is taken along line FF in FIG. 7B. The metal layers 620 in FIG. 7B are recessed with respect to dielectric layer 120.

After forming trench 710, another barrier layer 810 comprising a metal, such as tantalum, tungsten or molybdenum may be deposited over semiconductor device 600. Alternatively, other metals, such as other refractory metals, or combination of metals, may be used to form barrier layer 810. In an exemplary embodiment, barrier layer 810 may be deposited to a thickness ranging from about 10 Å to about 1000 Å. During this deposition, barrier layer 810 lines trench 710 and also forms a cap on the surface of metal layer 620, as illustrated in FIG. 8A.

Next, a metal layer 820, such as copper or aluminum, may be deposited on barrier layer 810 to fill trench 710. Similar to metal layer 620, metal layer 820 may be deposited using a PVD process followed by an electroplating process and may include a dopant introduced, for example, in the plating solution. During deposition of metal layer 820, some metal (not shown) may also be formed over barrier layer 810 and dielectric layer 120. An annealing process may then be performed followed by a CMP to planarize the top surface of metal layer 820 so that metal layer 820 is substantially planar with the top surface of the barrier layer 810, as shown in FIG. 8A.

FIG. 8B illustrates a top view of semiconductor device 600. The top view in FIG. 8B is oriented such that the cross-section in FIG. 8A is taken along line GG in FIG. 8B. As illustrated, semiconductor device 600 includes an interconnect structure 830 having three segments. The first segment includes metal layer 620 with a barrier layer 810 cap, along with barrier layer 210 located on the side surfaces and bottom surface. The second segment located in the center portion of structure 830 includes metal layer 820 and barrier layer 810 located on the side and bottom surfaces. The third segment includes metal layer 620 with a barrier layer 810 cap, along with barrier layer 210 located on the side surfaces and bottom surfaces. Therefore, in this embodiment, the top portion of the first and third segments surround metal layer 620 with a barrier layer 810 located on the top surface, in addition to the barrier layer 210 located along the side and bottom surfaces. Providing a barrier layer on the top surface of metal layer 620 may further increase backstress gradient in that segment of interconnect structure 830.

Figure 9:
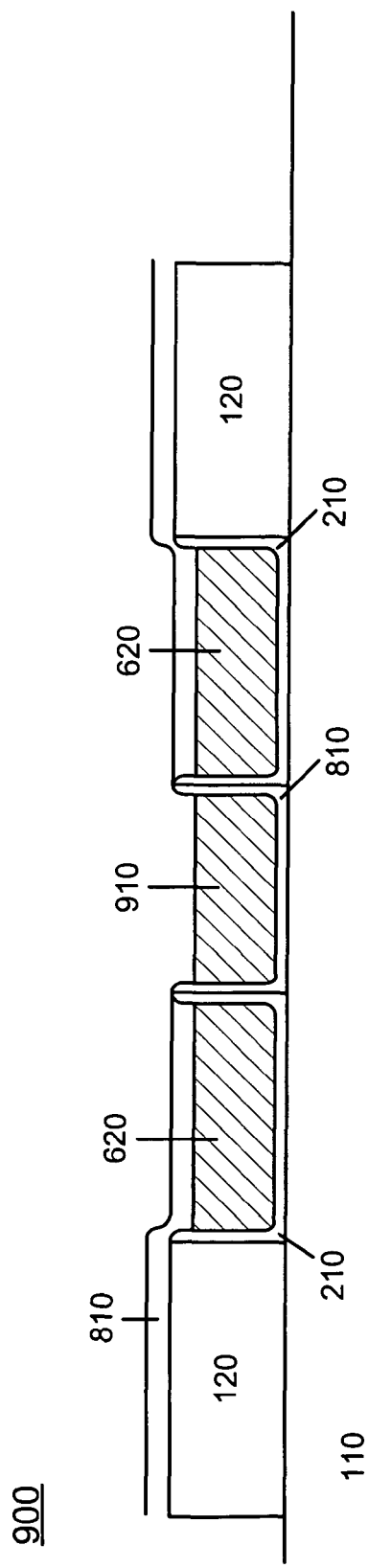
FIGS. 9-10D are cross-sections and a top view illustrating the formation of an interconnect structure in accordance with an embodiment of the invention.

In another alternative embodiment, a barrier layer may also be formed over the top surface of the center portion of the interconnect structure illustrated in FIGS. 8A and 8B. For example, referring to FIG. 9, semiconductor device 900 may include layers 110, 120, and barrier layer 210 and metal layer 620 formed in trenches 130 in a similar manner as that described above with respect to FIGS. 6, 7A and 7B. In this embodiment, barrier layer 810 may be deposited over semiconductor device 900 to line trench 710, as illustrated in FIG. 9. As illustrated, barrier layer 810 may also be formed over the surface of metal layers 620 and dielectric layer 120.

Next, a metal layer 910, such as copper or aluminum, may be deposited on barrier layer 810 to fill a portion of trench 710, as illustrated in FIG. 9. For example, in one implementation, metal layer 910 may be formed to a level ranging from about 10 Å to about 1000 Å below the top surface of dielectric layer 120. Similar to the discussion above with respect to metal layer 620, metal layer 910 may comprise copper or aluminum. In addition, metal layer 910 may be deposited using a PVD process followed by an electroplating process and may include a dopant introduced in the plating solution.

During deposition of metal layer 910, some metal (not shown) may also be formed over barrier layer 810. An annealing process may then be performed followed by a CMP to remove any metal formed over barrier layer 810. During this CMP, a top portion of metal layer 910 may also be removed (in situations where metal layer 910 completely fills trench 710), resulting in the top surface of metal layer 910 being recessed with respect to the upper surface of dielectric layer 120, as illustrated in FIG. 9. In still other alternatives, a relatively short etching process may be performed to remove a top portion of metal layer 910 such that metal layer 910 is recessed, as illustrated in FIG. 9.

Figure 10A:
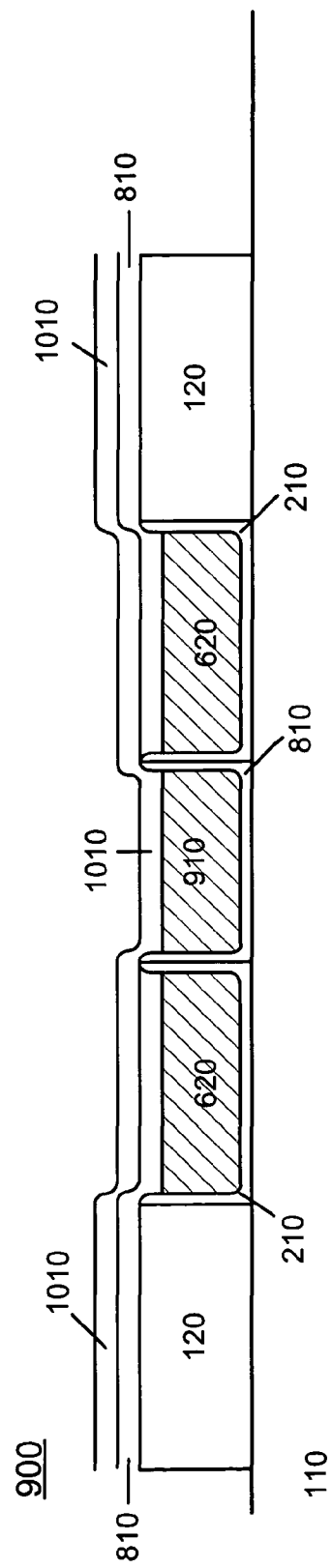

Next, another barrier layer 1010 comprising a metal, such as tantalum, tungsten or molybdenum may be deposited over semiconductor device 900, as illustrated in FIG. 10A. Alternatively, other metals, such as other refractory metals, or combination of metals, may be used to form barrier layer 1010. In an exemplary embodiment, barrier layer 1010 may be deposited to a thickness ranging from about 10 Å to about 1000 Å. During this deposition, barrier layer 1010 forms a cap on the surface of metal layer 910.

Figure 10B:
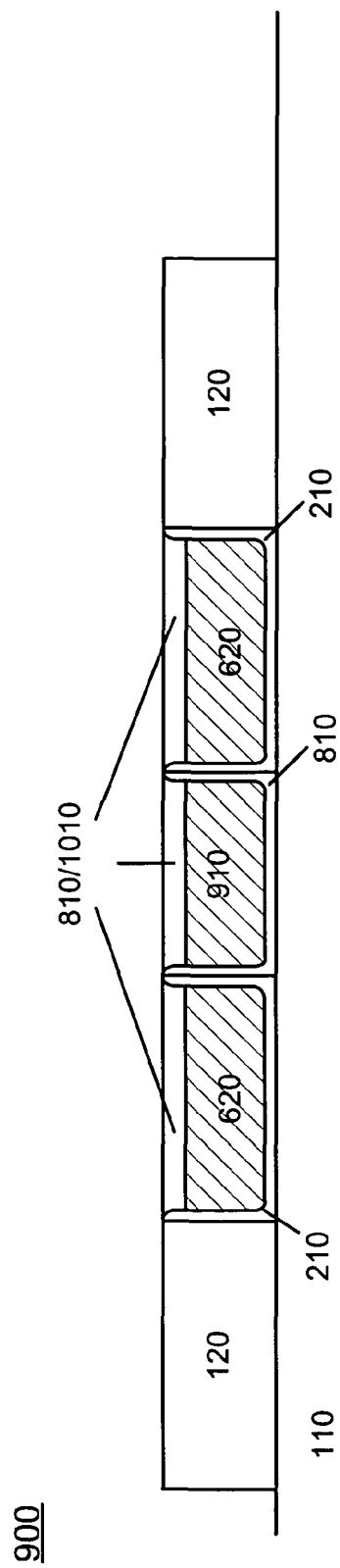

A CMP may then be performed to remove portions of barrier layer 810 and 1010 formed over dielectric layer 120 and to planarize the top surface of these barrier layers, as illustrated in FIG. 10B. The resulting interconnect includes a metal portion (i.e., metal layers 620 and 910) each having barrier layers (810 and 1010) formed adjacent the top surface in addition to the barrier layers (210 and 810) formed along the side and bottom surfaces.

FIG. 10C illustrates a top view of semiconductor device 900 of FIG. 10B. As illustrated, semiconductor device 900 includes an interconnect structure 1030 having three segments. The first segment includes metal layer 620 with a barrier layer 810 cap formed on the top surface, along with barrier layer 210 located on the side surfaces and bottom surface. The second segment located in the center portion of structure 1030 includes metal layer 910 with a barrier layer 1010 cap formed on the top surface, along with barrier layer 810 formed along the side surfaces and bottom surface. The third segment includes metal layer 620 with a barrier layer 810 cap, along with barrier layer 210 located on the side surfaces and bottom surfaces. Therefore, in this embodiment, each of the segments includes a metal layer surrounded by a barrier layer. As discussed above, surrounding the metal layer (i.e., metal layer 620 and 910) with a barrier layer on the top surface in addition to the barrier layer on the side and bottom surfaces may further increase backstress gradient as compared to surrounding only three surfaces of the metal layer.

FIG. 10D illustrates a cross-sectional view of semiconductor device 900 taken along line HH in FIG. 10C. As illustrated in FIG. 10D, the cross section of interconnect structure 1030 includes metal layer 620 with barrier layer 210 surrounding the side surfaces and bottom surface of metal layer 620 and barrier layer 810 formed on the top surface of metal layer 620. It should be understood that barrier layers 210 and 810 may include the same material and are depicted with different numbers based on the exemplary processing described above in which these layers were deposited at different times. For example, barrier layers 210 and 810 may both be, for example, tantalum layers. Alternatively, barrier layers 210 and 810 may comprise different materials.

Referring back to FIG. 10D, the thickness of barrier layer 210 formed adjacent the side surfaces of metal layer 620 (labeled t2), the thickness of barrier layer 210 formed adjacent the bottom surface of metal layer 620 (labeled t3) and the thickness of barrier layer 810 formed adjacent the top surface of metal layer 620 (labeled t4) may vary based on the particular circuit requirements. In an exemplary implementation, t2 may range from about 10 Å to about 500 Å, t3 may range from about 10 Å to about 500 Å and t4 may range from about 10 Å to about 1000 Å. As discussed above, in some implementations, having a thicker barrier layer formed adjacent the side surfaces of a metal layer (e.g., metal layer 220 in FIG. 5B), as opposed to a thicker barrier layer formed along the bottom surface or top surface of the metal layer may yield the desired results associated with avoiding electromigration. In some implementations in which the barrier layer is also formed along the top surface of the metal layer (e.g., barrier layer 810 in FIG. 10D), providing a thinner barrier layer along the top surface of metal layer 620 as compared to the side and bottom surfaces of metal layer 620 may yield the desired results associated with avoiding electromigration.

Similar to the discussion above with interconnect structure 430, each of the segments of interconnect structure 830 (FIG. 8B) and interconnect structure 1030 (FIG. 10C) are immortal. That is, the length (L) of each of the segments of these interconnect structures is designed to be less than or equal to a predetermined distance $L_B$, such that the product of the current density j and length L of the segment is less than $jL_{crit}$. The particular lengths of each segment, however, may vary based on the particular end device and its operating requirements. One of ordinary skill in the art, however, would be able to optimize L for each segment based on the guidance given herein. Advantageously, the barrier structures formed at the junctions of each of the segments, along with the portions of barrier layers formed along the side surfaces, bottom surfaces and top surfaces of the metal layers (e.g., metal layers 620, 820, 910) act to counter mass flux in interconnect structures 830 and 1030, thereby rendering each segment and the overall interconnect structures 830/1030 immortal.

In still another embodiment consistent with the invention, semiconductor device 1100 may include layer 110 with layer 120 formed thereon and trenches 130 formed in layer 120, as illustrated in FIG. 11A. Trenches 130 may be formed in semiconductor device 1100 in a similar manner as that described above with respect to FIG. 1B.

A barrier layer may be deposited, followed by an etching to form barrier structures 1110 on the sides of trenches 130, as illustrated in FIG. 11B. Barrier structures 1110 may comprise a metal, such as tantalum, tungsten or molybdenum. Alternatively, other metals, such as other refractory metals, or combination of metals, may be used to form barrier structures 1110. FIG. 11C illustrates a top view of the semiconductor device 1100 of FIG. 11B.

Figure 12A:
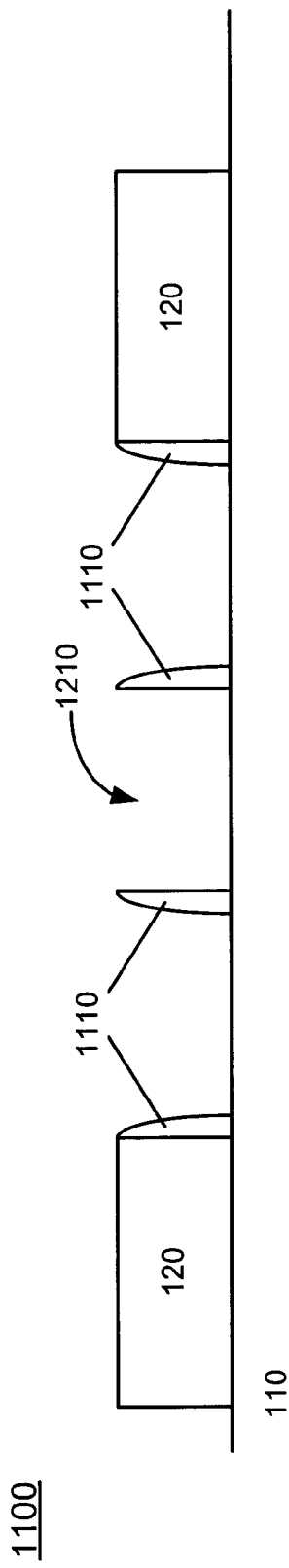
Figure 12B:
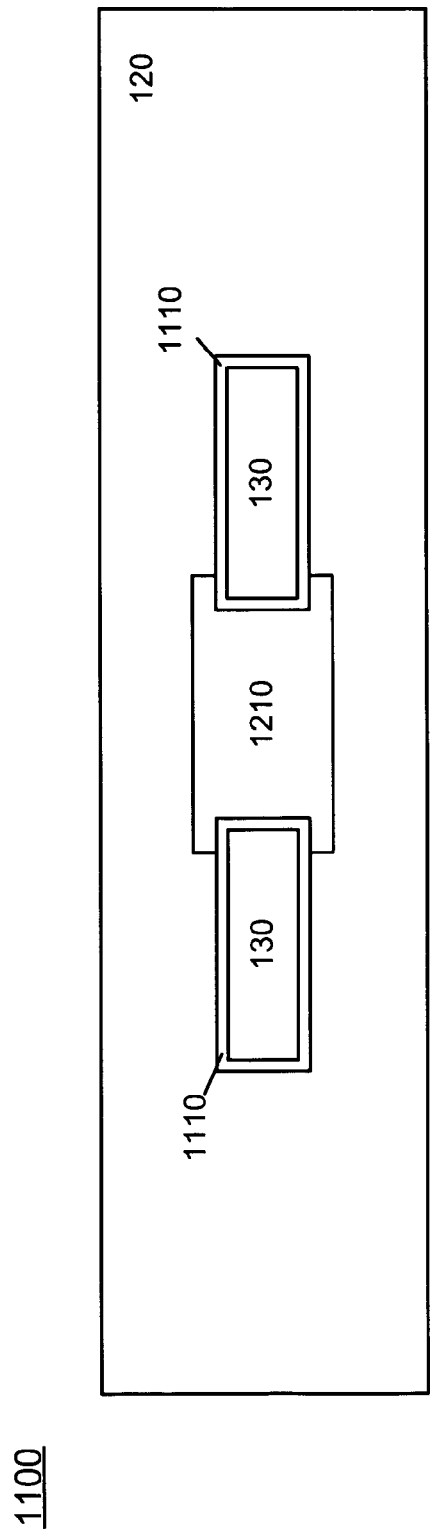

Next, a trench 1210 may be formed by removing a portion of dielectric layer 120, as illustrated in FIG. 12A. In FIG. 12A, the middle portion of dielectric layer 120 illustrated in FIG. 11B was removed using, for example, an etching process. FIG. 12B illustrates a top view of semiconductor device 1100 of FIG. 12A.

After forming trench 1210, another barrier layer 1310 comprising a metal, such as tantalum, tungsten or molybdenum may be deposited over semiconductor device 1100, as shown in FIG. 13A. Alternatively, other metals, such as other refractory metals, or combination of metals, may be used to form barrier layer 1310. In an exemplary embodiment, barrier layer

1310 may be deposited to a thickness ranging from about 10 Å to about 1000 Å. During this deposition, the barrier layer 1310 lines trenches 130 and 1210, as illustrated in FIG. 13A Next, a metal layer 1320, such as copper or aluminum, may be deposited on barrier layer 1310 to fill trenches 130 and 1210. Metal layer 1320 may be deposited using a PVD process followed by an electroplating process and may include a dopant introduced in the plating solution. During deposition of metal layer 1320, some metal (not shown) may also be formed over barrier layer 1310 and dielectric layer 120. An annealing process may then be performed followed by a CMP to planarize the top surface of metal layer 1320 so that metal layer 1320 is substantially planar with the top surface of dielectric layer 120, as shown in FIG. 13B.

FIG. 13C illustrates a top view of semiconductor device 1100 of FIG. 13B. As illustrated, semiconductor device 1100 includes an interconnect structure 1330 having three segments. Each segment includes metal layer 1320 with barrier layer 1310 surrounding the side surfaces and bottom surface of the metal layer 1320. In addition, barrier layer 1310 and barrier structures 1110 are formed at the junctions of each segment of interconnect structure 1330. Advantageously, barrier structures 1110 and barrier layer 1310 act to counter mass flux in interconnect structure 1330, thereby rendering each segment and the overall interconnect structure 1330 immortal.

In another alternative, metal layer 1320 illustrated in FIG. 13B may be recessed with respect to the top surface of dielectric layer 120. For example, FIG. 14A illustrates the formation of metal layer 1320, such that metal layer 1320 is recessed with respect to the top surface of dielectric layer 120. In this case, metal layer 1320 may be deposited such that it does not fill the trenches. Alternatively, a CMP process and/or a light etching process may be performed to remove a top portion of metal layer 1320 such that metal layer 1320 is recessed with respect to the top surface of dielectric layer 120, as illustrated in FIG. 14A. Next, another barrier layer 1410 may be deposited over semiconductor device 1100 followed by a CMP to planarize the top surface of barrier layer 1410 with the top surface of dielectric layer 120, as illustrated in FIG. 14B.

FIG. 14C illustrates a top view of semiconductor device 1100 of FIG. 14B. As illustrated, semiconductor device 1100 includes an interconnect structure 1430 having three segments. Each segment includes metal layer 1320 with barrier layer 1310 surrounding the side surfaces and bottom surface of the metal layer 1320. In addition, each segment includes barrier layer 1410 formed over the top surface of metal layer 1320. Further, barrier structures 1110 are formed at the junctions of each segment of interconnect structure 1430. Advantageously, barrier structures 1110 and barrier layer 1310/1410 act to counter mass flux in interconnect structure 1430, thereby rendering each segment and the overall interconnect structure 1430 immortal.

In summary, implementations consistent with the invention form interconnects that avoid electromigration problems. The interconnects may include a number of segments, where each segment may include barrier layers and/or barrier structures that enable the interconnect to avoid electromigration problems. Advantageously, the resulting interconnect structure is immortal and may be used to fabricate more reliable circuits.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in semiconductor devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. In a semiconductor device, an interconnect comprising:
a plurality of segments, each segment comprising a first metal, a second metal, and a third metal, the second metal being different from the first metal, the third metal being different from the second metal and the first metal, the second metal being formed adjacent two side surfaces of the first metal and a bottom surface of the first metal, and contacting the two side surfaces and the bottom surface over an entire length of each respective segment, the third metal being formed on a top surface of the first metal, and contacting the top surface of the first metal and a portion of inner side surfaces of the second metal; and
a plurality of barrier structures, each of the plurality of barrier structures being located between and in contact with two of the plurality of segments,
where each of the plurality of barrier structures comprises a refractory metal, and
where the plurality of segments and the plurality of barrier structures together form a continuously conductive interconnect.

2. The interconnect of claim 1, where the first metal comprises copper.

3. The interconnect of claim 2, where at least one of the plurality of barrier structures comprises tantalum.

4. The interconnect of claim 1, where the first metal comprises copper and the second metal comprises a refractory metal.

5. The interconnect of claim 1, where a length of at least one segment, of the plurality of segments, is equal to or less than a Blech length.

6. A semiconductor device comprising:
a semiconductor substrate;

at least one conductive structure formed above the semiconductor substrate; and a continuously conductive interconnect coupled to the at least one conductive structure, the continuously conductive interconnect comprising:

a plurality of segments, each segment comprising a first metal, a second metal, and a third metal, the second metal being different from the first metal and being formed adjacent two side surfaces and a bottom surface of the first metal, and the second metal contacting the two side surfaces and the bottom surface of the first metal, over an entire length of each respective segment, the third metal being different from the second metal and the first metal, the third metal being formed on a top surface of the first metal, and contacting the top surface of the first metal and a portion of inner side surfaces of the second metal, and at least one structure formed between and in contact with a first one and second one of the plurality of segments.

7. The semiconductor device of claim 6, where the at least one structure comprises a plurality of structures, each of the plurality of structures being located between and in contact with two of the plurality of segments.

8. The semiconductor device of claim 6, where the first metal comprises copper and the at least one structure comprises tantalum.

9. The semiconductor device of claim 6, where the second metal comprises a refractory metal formed adjacent the first metal.

10. The semiconductor device of claim 9, where the refractory metal in each of the plurality of segments is formed over an entire top surface of the first metal.

11. An interconnect in a semiconductor device, the interconnect comprising:

a plurality of segments, each segment comprising a first metal, a second metal, and a refractory metal, the refractory metal being different from the first metal and the second metal, the first metal being different from the second metal, the refractory metal being formed adjacent two side surfaces and a bottom surface of the first metal, the second metal being formed above a top surface of the first metal, where the refractory metal contacts the two side surfaces and the bottom surface of the first metal, over an entire length of each respective segment, where the second metal contacts the top surface of the first metal and a portion of inner side surfaces of the refractory metal; and at least one structure located between and in contact with a first one and a second one, of the plurality of segments, where the plurality of segments and the at least one structure together form a continuously conductive interconnect.

12. The interconnect of claim 11, where the first metal comprises copper and the refractory metal comprises tantalum.

13. The interconnect of claim 11, where the at least one structure comprises a same refractory metal as each of the plurality of segments.

14. The interconnect of claim 11, where the at least one structure comprises a plurality of structures, each of the plurality of structures being located between and in contact with two of the plurality of segments.

15. The interconnect of claim 11, where the first metal comprises copper.

16. The interconnect of claim 11, where the second metal comprises tantalum, tungsten, or molybdenum.

17. The interconnect of claim 11, where the plurality of segments includes three segments.

18. The semiconductor device of claim 6, where the at least one structure comprises a refractory metal, and where the at least one structure has a width ranging from about 10 Å to about 2000 Å.

19. The semiconductor device of claim 6, where each of a first segment and a second segment, of the plurality of segments, has a length that is less than or equal to a Blech length, and where a third segment, of the plurality of segments, has a length that is less than the Blech length.

* * * * *